United States Patent
Burdick, Jr. et al.

(10) Patent No.: US 7,289,336 B2
(45) Date of Patent: Oct. 30, 2007

(54) ELECTRONIC PACKAGING AND METHOD OF MAKING THE SAME

(75) Inventors: William Edward Burdick, Jr., Niskayuna, NY (US); James Wilson Rose, Guilderland, NY (US); John Eric Tkaczyk, Delanson, NY (US); Oded Meirav, Haifa (IL); Jerome Stephen Arenson, Haifa (IL); David Michael Hoffman, New Berlin, WI (US)

(73) Assignee: General Electric Company, Schenectady, NY (US)

( * ) Notice: Subject to any disclaimer, the term of this patent is extended or adjusted under 35 U.S.C. 154(b) by 317 days.

(21) Appl. No.: 10/975,952

(22) Filed: Oct. 28, 2004

(65) Prior Publication Data

US 2006/0092615 A1    May 4, 2006

(51) Int. Cl.
*H05K 1/11* (2006.01)
(52) U.S. Cl. .................. 361/803; 361/749; 257/428
(58) Field of Classification Search ........ 361/803, 361/749; 257/428–434, 459, 460, 700; 438/64–67
See application file for complete search history.

(56) References Cited

U.S. PATENT DOCUMENTS

| | | | |
|---|---|---|---|
| 4,617,730 A | 10/1986 | Geldermans et al. | 29/843 |
| 4,783,695 A | 11/1988 | Eichelberger et al. | 257/668 |
| 4,933,042 A | 6/1990 | Eichelberger et al. | 156/239 |
| 6,242,282 B1 | 6/2001 | Fillion et al. | 438/106 |
| 6,940,141 B2 * | 9/2005 | Kinsman | 257/433 |
| 2005/0167606 A1 * | 8/2005 | Harrison et al. | 250/370.13 |

* cited by examiner

*Primary Examiner*—Dean A. Reichard
*Assistant Examiner*—Yuriy Semenenko
(74) *Attorney, Agent, or Firm*—Fletcher Yoder

(57) ABSTRACT

An interconnect structure for use in an electronic device, wherein the interconnect structure comprises a first substrate comprising a flexible material, wherein the first substrate comprises a front side and a back side, and wherein the first substrate is configured to receive a sensor on the front side; and a second substrate coupled to the back side of the first substrate and comprising a rigid material. A detector module for use in an imaging system comprises the aforementioned interconnect structure.

48 Claims, 6 Drawing Sheets

ELECTRONIC PACKAGING AND METHOD OF MAKING THE SAME

BACKGROUND

The invention relates generally to electronic packaging. In particular, the invention relates to electronic packaging for sensor arrays and a method of making the same.

As integrated circuit device densities increase and device sizes shrink, system performance is increasingly impacted by limitations in interconnect technology and packaging of the chips used to fabricate the devices. For example, package limitations, such as the maximum allowable number of chip input/output contacts, have resulted in the inability to utilize all of the chip's capabilities. Multi-chip packaging generally requires wide spacing of chips to accommodate wiring channels, which results in longer chip interconnects, increased parasitic capacitance and a decrease in system speed. Moreover, complex packaging structures may be expensive and unreliable.

Current x-ray detectors generally rely on standard electronic packaging and interconnect technology, processes, materials etc., including printed circuit boards, surface mount technology (SMT) packages, ceramic substrates, etc. However, current interconnect and packaging technologies, which utilize rigid substrates for fabrication are limited in resolution and pitch capabilities. Accordingly, high density packaging of the order of 100 to 800 contacts/cm$^2$ are desirable to achieve the full potential of x-ray detectors. Disadvantageously, such high densities may not be possible to achieve with rigid substrates for chip interconnect.

In the case of photon counting X-ray detectors, it is generally desirable to have pixel pitch smaller than 1 mm. This enables the detector to be used at higher X-ray flux. Typically, these detectors are limited to counting photons at a rate of 1 million counts per second. For pixels with an area of approximately 1×1 mm$^2$, the corresponding maximum flux rate is 1 million counts per second per mm$^2$, whereas for pixels with an area of 0.5×0.5 mm$^2$, the maximum flux rate is 4 million counts per second per mm$^2$. Even finer pixel pitch would allow higher flux rates to be counted, thereby benefiting applications where high statistical significance is needed. For example, in X-ray imaging applications, the contrast to noise ratio is a quality metric which is proportional to the square root of the number of x-rays counted. Many benefits of photon counting detectors are dependent on the ability to count sufficient number of x-rays in order to achieve statistical significance. Therefore it is advantageous to provide a packaging technology to achieve high interconnect density, where small area sensor pixels are routed to readout electronic inputs.

Sometimes, multilayer ceramic substrates (MLCs) are used as alternatives to standard electronic packaging. Today's chips require more connections between the chip and the MLC and also require connections on denser grids. This requirement makes it difficult to make MLCs economically, exacerbates electrical noise problems and causes yield problems since redistribution planes of greater complexity will be needed.

Flexible substrates may be used to achieve relatively high density input/output contacts. However, during fabrication, these flexible substrates (e.g., polyimide) are subjected to temperatures and mechanical forces that cause the substrate material to stretch, shrink and otherwise change in physical dimensions both during and upon completion of processing. These dimensional changes and instability can be minimized, but not to the extent that it is currently feasible to produce ultra fine pitch multi-layer flexible interconnect with trace pitches at or under 0.030 mm, at high yield. Due to these limitations flexible substrates are costly to fabricate and employ as the complete interconnect substrate.

Therefore, there is a need to obtain a simpler method of making high density electronic packaging and low cost interconnect components. There is also a need for allowance for testability of components before connecting to the assembly.

BRIEF DESCRIPTION

In one aspect of the present technique, an interconnect structure for an electronic device is provided. The interconnect structure includes a first substrate having a flexible material, wherein the first substrate comprises a front side and a back side, and wherein the first substrate is configured to receive a sensor on the front side, and a second substrate coupled to the back side of the first substrate and comprising a rigid material.

In another aspect of the present technique, a sensor assembly for use in an electronic system is provided. The sensor assembly includes a first substrate having a flexible material, wherein the first substrate comprises a front side and a back side, and wherein the first substrate is configured to receive a sensor on the front side, and a second substrate coupled to the back side of the first substrate and comprising a rigid material. The sensor assembly further includes a sensor array disposed on the front side of the first substrate, wherein the sensor array is configured to receive waveform signals and convert the waveform signals to corresponding electrical signals, and at least one electronic device configured for converting the electrical signals to corresponding digital signals.

In yet another aspect of the present technique, a detector for use in an imaging system is provided, which includes at least one sensor array configured for receiving waveform signals and converting the waveform signals to corresponding electrical signals, at least one electronic device configured for converting the electrical signals to corresponding digital signals, and an electronic circuit having an interconnect structure fabricated in accordance with aspects of the present technique.

In still another aspect of the present technique, a method for manufacturing a sensor assembly is provided. The method comprises providing a first substrate having a flexible material, wherein the first substrate comprises a front side and a back side, and wherein the first substrate is configured to receive a sensor on the front side, coupling a sensor to the front side of the first substrate to form a first assembly, and coupling a second substrate comprising a rigid material to a backside of the first substrate to form a second assembly.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
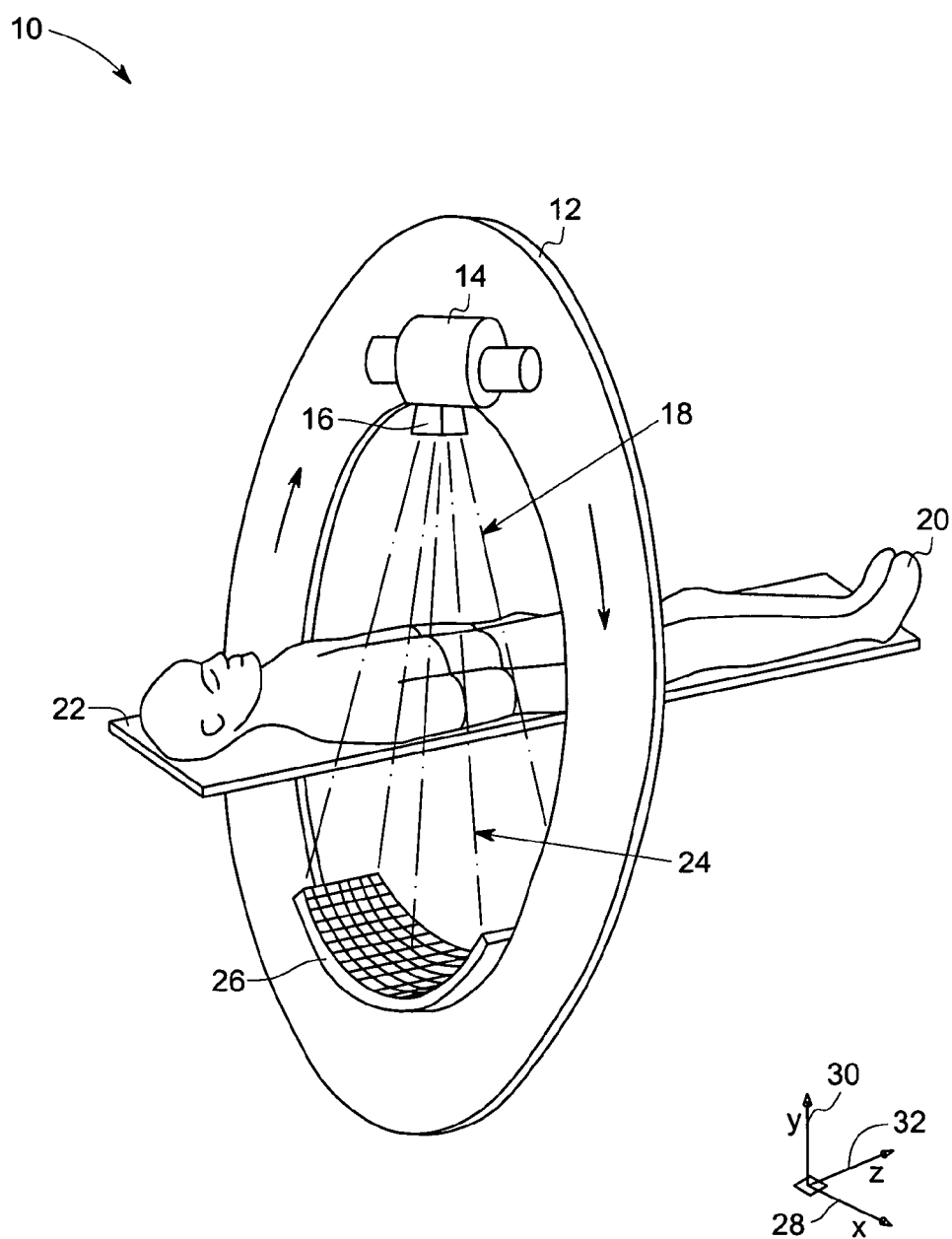
FIG. 1 is a perspective view of an exemplary imaging system in accordance with one aspect of the present technique.

In accordance with one aspect of the present technique, the interconnect structure described herein is used in a detector for an imaging system. FIG. 1 illustrates an exemplary imaging system, such as a computed tomography, X-ray fluoroscopy, positron emission tomography, or digital X-ray imaging. In the illustrated embodiment, the imaging system 10 includes an annular structure 12 supporting the radiation source 14 and the collimator 16 on one side of the target 20 (e.g., patient), while a detector 26 is supported on an opposite side of the X-ray radiation source 14. The annular structure 42 may be rotatable about the target 20 to acquire a desired image of the target's internal features. During operation, the radiation source 14 emits radiation towards the collimator 16, which then collimates the radiation as collimated beams 18. In certain embodiments, the radiation may be X-ray radiation, beta radiation, or gamma radiation. The collimated beams 18 are directed toward a target 20 disposed on a support, such as table 22. The table 22 can be moved through an aperture in the gantry 12 to appropriately position the target in an imaging volume during imaging. The target 20 may be a human, baggage, an object, or any other target having internal features or contents. On incidence, a portion of the radiation, generally termed as attenuated radiation 24, passes through the target 20. More specifically, the internal features of the target 20 at least partially reduce the intensity of the collimated beams 18. In turn, attenuated radiation 24 impinges one or more radiation detectors 26. The imaging system 10 then processes these electrical signals to construct an image of the internal features within the target 20. In certain embodiments of the present technique, the target 20 is disposed along a z-direction represented by reference numeral 32. Further, an x-direction is represented by reference numeral 28 and a y-direction is represented by a reference numeral 30.

Figure 2:
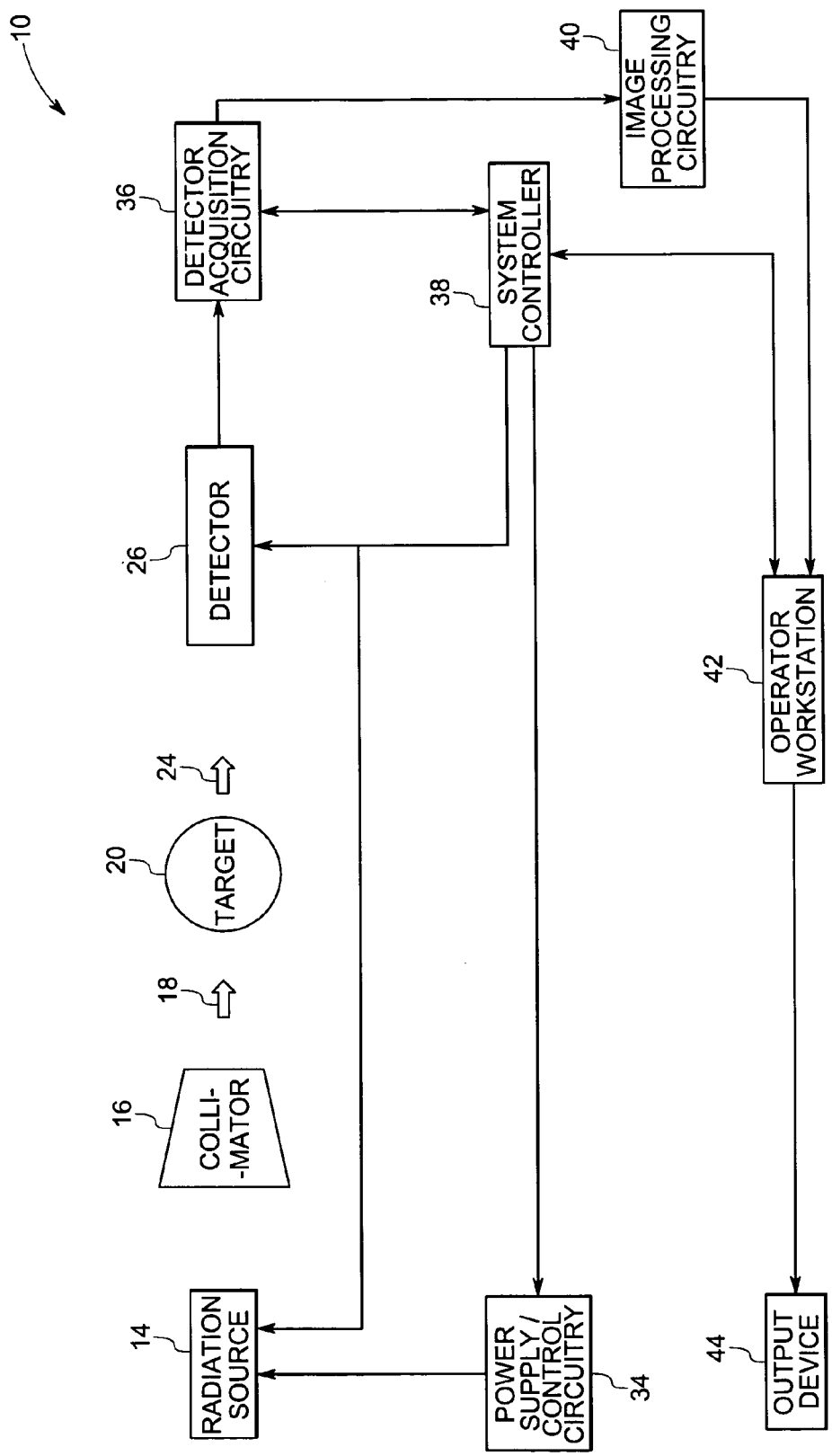
FIG. 2 is a diagrammatic representation of an exemplary imaging system according to one aspect of the present technique.

In addition, the imaging system 10 of FIG. 1 may include a variety of control circuiting and devices. As illustrated in FIG. 2, the radiation source 14 is controlled by a power supply/control circuit 34, which furnishes both power and control signals for examination sequences. Moreover, the detector 26 is coupled to detector acquisition circuitry 36, which controls acquisition of the signals generated in the detector 26. In certain embodiments, the imaging system 10 includes a motor subsystem (not shown) to facilitate motion of the radiation source 14 and/or the detector 26. The power supply/control circuit 34 and the optional motor subsystem are responsive to signals from a system controller 38. The system controller 38 generally controls operation of imaging processing circuitry 40 to execute examination protocols and to process acquired image data. These and various other control mechanisms may be incorporated into the imaging system 10 in accordance with certain embodiments of the present technique.

As an interface to the imaging system 10, one or more operator workstations 42 may be included for outputting system parameters, requesting examination, viewing images, and so forth. The operator workstation 42 is configured to enable an operator, via one or more input devices (keyboard, mouse, touchpad, etc.), to control the operation of the system controller 38 and, if necessary, other components of the imaging system 10. The illustrated operator workstation 42 is coupled to an output device 44, such as a display or printer, to output the images generated during operation of the imaging system 10. In general, displays, printers, operator workstations, and similar devices may be local or remote from the imaging system 10. For example, these interface devices may be positioned in one or more places within an institution or hospital, or in an entirely different location. Therefore, the interface devices may be linked to the imaging system 10 via one or more configurable networks, such as the internet, virtual private networks, and so forth. These and other input/output devices or interfaces may be incorporated into the imaging system 10 in accordance with embodiments of the present technique.

Figure 3:
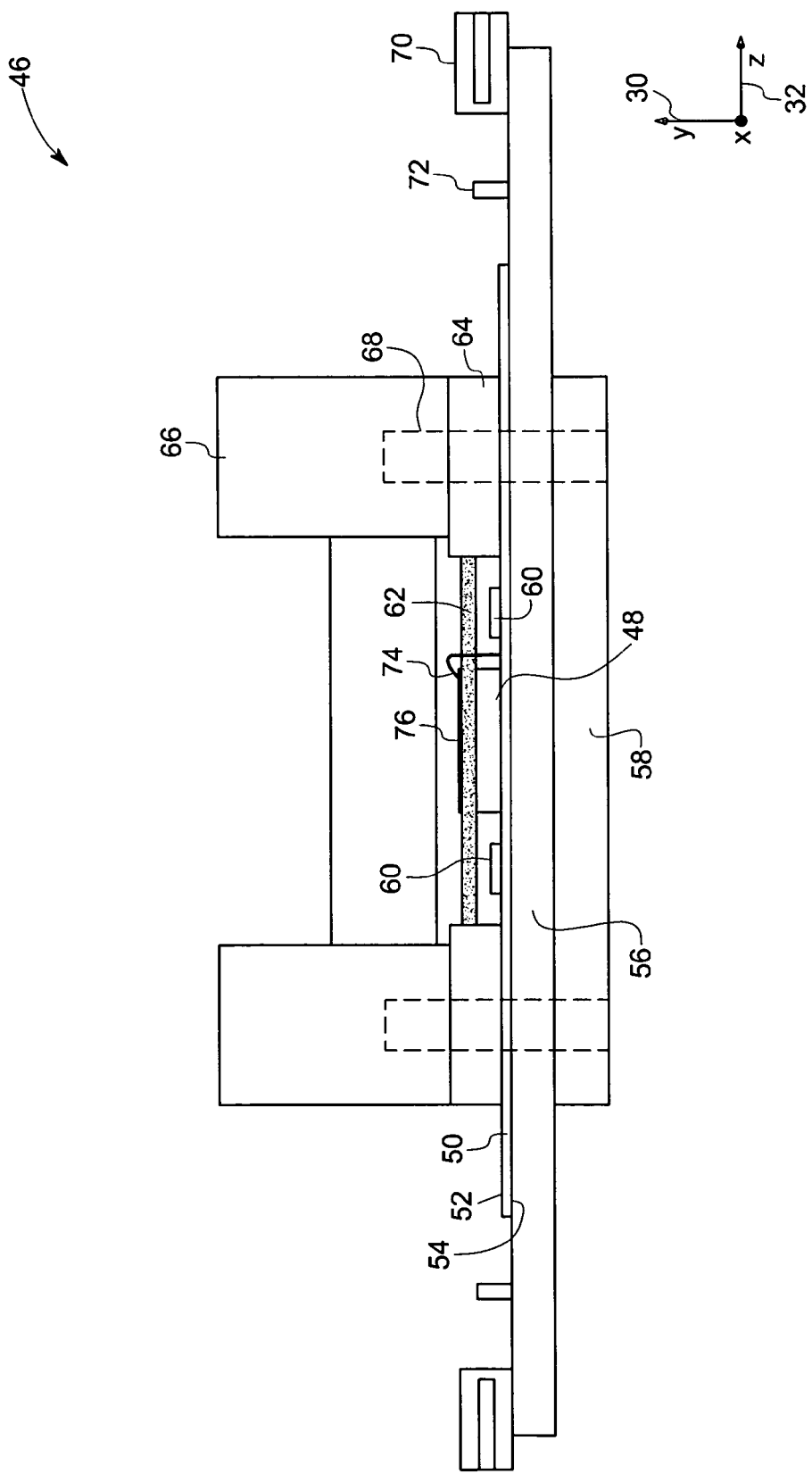
FIG. 3 is a diagrammatic illustration of a sensor assembly according to one aspect of the present technique.

FIG. 3 illustrates a sensor assembly 46 employed in the detector 26. The sensor assembly 46 includes a sensor array 48 configured for receiving waveform signals, such as, X-rays or acoustic signals and converting the waveform signals to corresponding electrical signals. In an exemplary embodiment, the waveform signals may be X-ray signals that may be employed in a computed tomography detector. In another exemplary embodiment, the waveform signals may be acoustic signals that may be employed in an ultrasound detector. In certain exemplary embodiments of the present technique, the interconnect structure is employed in X-ray imaging systems. In these embodiments, the sensor array 48 may include an X-ray detecting material such as a scintillator material along with a photodiode or a direct conversion material. In certain embodiments, the sensor array is tile-able in z-direction. The detector also includes one or more electronic devices configured for converting the electrical signals to corresponding digital signals.

In the illustrated embodiment, the sensor array 48 is disposed on an interconnect structure. The interconnect structure has a first substrate 50 comprising a flexible material. The first substrate 50 comprises a front side 52 and a back side 54, where the first substrate 50 is configured to receive a sensor on the front side 52. The interconnect structure further comprises a second substrate 56. The sensor array 48 is disposed on the front side 52 of the first substrate 50 of the interconnect structure. The first substrate 50 includes a material configured to have a high density and low pitch of the plurality of input/output (I/O) contacts, wherein the high density of the plurality of I/O contacts is in a range from about 100 to about 800 contacts per cm$^2$. Similarly, the second substrate 56 includes a material configured to have a low density and high pitch of a plurality of I/O contacts, wherein the low density of the plurality of I/O contacts is in a range from about 25 to about 100 contacts per cm$^2$. In certain embodiments, the first substrate 50 is made from a polymer such as, but not limited to polyimide, polyethylene terephthalate, or polyetherimide.

The back side 54 of the first substrate 50 is coupled to a second substrate 56 to form an interconnect structure. The second substrate 56 is made of a rigid material and may include a printed circuit board, ceramic substrate, mechanical support, or combinations thereof. In certain embodiments of the present technique, the second substrate 56 may be used to provide fanout from an electronic device, such as, the sensor array 48, disposed on the first substrate 50. As described in more detail below, the fanout configuration distributes the high density configuration of the sensor array 48 to match a less dense configuration of I/O contacts patterned on the back side of the second substrate 56. Advantageously, by providing fanout the density of the sensor array 48 coupled to the first substrate is not limited by processing capabilities of low density substrates. The interconnect structure may include more than two substrates, for example, in the illustrated embodiment the second substrate is coupled to a mechanical substrate 58, such as an alumina substrate. Advantageously, the mechanical substrate 58 may be made of a material that is compatible with another substrate of the interconnect structure to which it is mechanically coupled. This minimizes mechanical stress and strain, and provides more reliability to the interconnect structure. For example, in the illustrated embodiment of FIG. 1, coefficient of thermal expansion (CTE) of the mechanical substrate should be compatible with the CTE of the second substrate 56.

Further, the sensor assembly 46 also includes one or more electronic devices such as, application specific integrated circuits (ASICs) 60, which are used to convert analog signals from the sensor array 48 into digital signals. In the illustrated embodiment, ASIC 60 is not restricted by design to one position in particular and may be able to occupy different positions relative to the sensor array 48. The position of the ASIC 60 on the first substrate 50 may vary depending on the need of heat removal or desirable performance. For example, although it is desirable to place the ASIC 60 near the sensor to facilitate fast transfer of signals from the sensor array 48 to the ASIC 60, but close proximity between the sensor array 48 and the ASIC 60 hinders heat removal. Hence, the ASIC may be disposed at an optimum distance from the sensor array 48 with this trade-off in mind. Though in the illustrated embodiment, the ASIC 60 is disposed on the first substrate 50, it may also be disposed on the second substrate as described in greater detail below with reference to FIG. 4.

The sensor assembly 46 also includes an alignment carrier 62, which is usually a frame with a rectangular hole and which is used to hold the sensor array 48 in place. The alignment carrier 62 is mechanically coupled to a spacer 64 on either side of the sensor array 48. The spacer 64 in turn is attached to the interconnect structure by means of rails 66 which are bolted to the interconnect structure using bolts 68. The bolts 68 are usually made of stainless steel and are drilled into the interconnect structure. The sensor assembly 46 further comprises a system connector 70 and a high voltage connector 72 which are usually soldered to the interconnect structure. Both, the system connector 70 and the high voltage connector 72 may be either coupled to the first substrate or to the second substrate. The system connector may be used to provide power to the sensor assembly 46 or to ground the sensor assembly 46. The high voltage connector 72 may be used to supply high voltage bias to at least one common high voltage contact 76 disposed on top of the sensor array 48. The sensor assembly 46 further includes a wire bond connector 74 connecting the common high voltage contact 76 disposed on top of the sensor array 48 to the first substrate 50. In an alternate embodiment, the connector 74 comprises a flexible printed circuit such as a metal on polyimide film.

Figure 4:
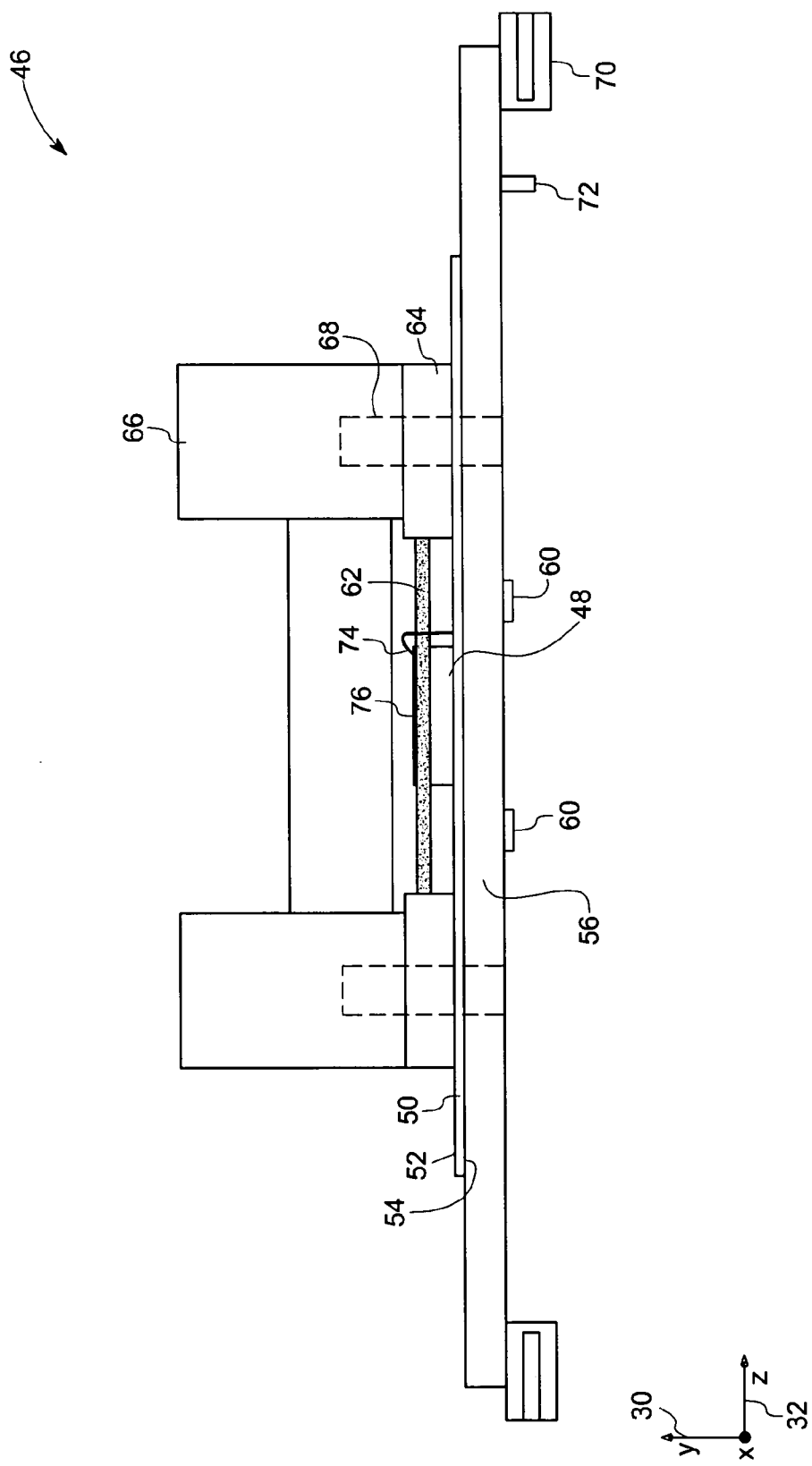
FIG. 4 is a diagrammatic illustration of a sensor assembly according to another aspect of the present technique.

FIG. 4 illustrates another embodiment of the present technique, where the ASICs 60 are disposed on the second substrate 56 of the interconnect structure. In this embodiment, position of other devices such as, the system connector 70 and the high voltage connector 72 may also be changed as compared to that shown in FIG. 3. For example, the system connector 70 and the high voltage connector 72 may be disposed on the second substrate 56.

Figure 5:
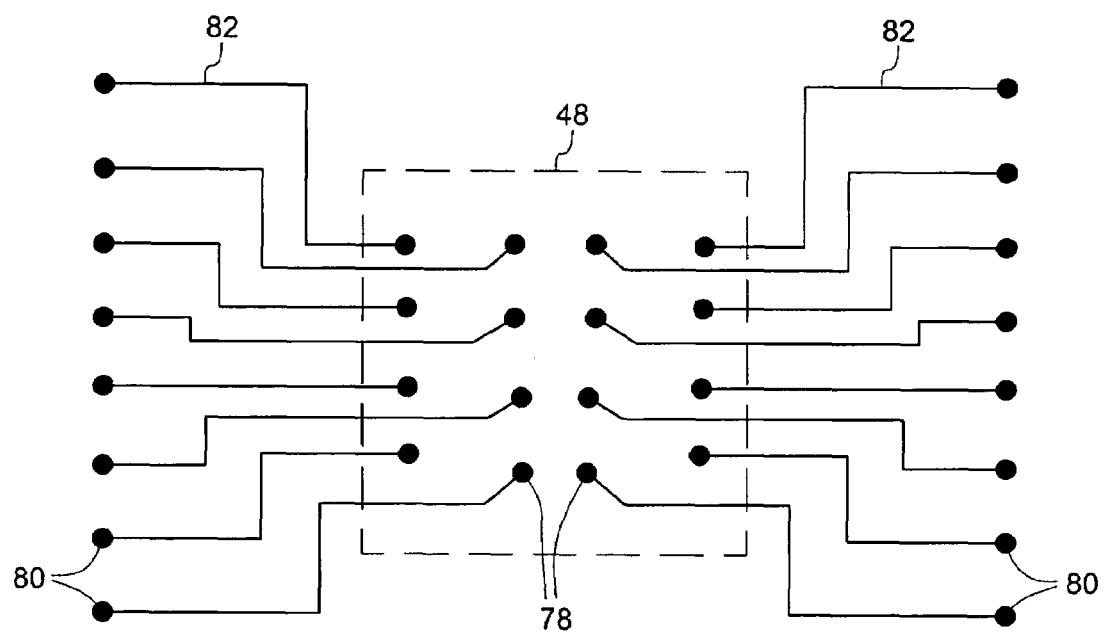
FIG. 5 is a diagrammatic illustration of a fanout employed in the interconnect structure according to one aspect of the present technique.

FIG. 5 illustrates a top view of a fanout circuit employed in the interconnect structure according to one aspect of the present technique. In the illustrated embodiment, the sensor array 48 is coupled to the first substrate 50 via I/O contacts 78 which are then connected to I/O contacts 80 on the second substrate 56 via interconnect traces 82. In some embodiments, as illustrated in FIG. 3 where the ASIC 60 is employed on the first substrate 50, the interconnect traces of the fanout circuit are in a z-direction 32. That is to say, the interconnect traces fanout from the first substrate 50 onto the second substrate 56 and again fan-in onto the first substrate 50 to connect to the ASIC. In other embodiments, as illustrated in FIG. 4 where the ASIC 60 is employed on the second substrate, the fanout is in a y-direction 30. That is, the interconnect traces from the sensor array 48 disposed on the flexible substrate 50 are traced to the second substrate and then to the ASIC 60 disposed on the second substrate 56.

Figure 6:
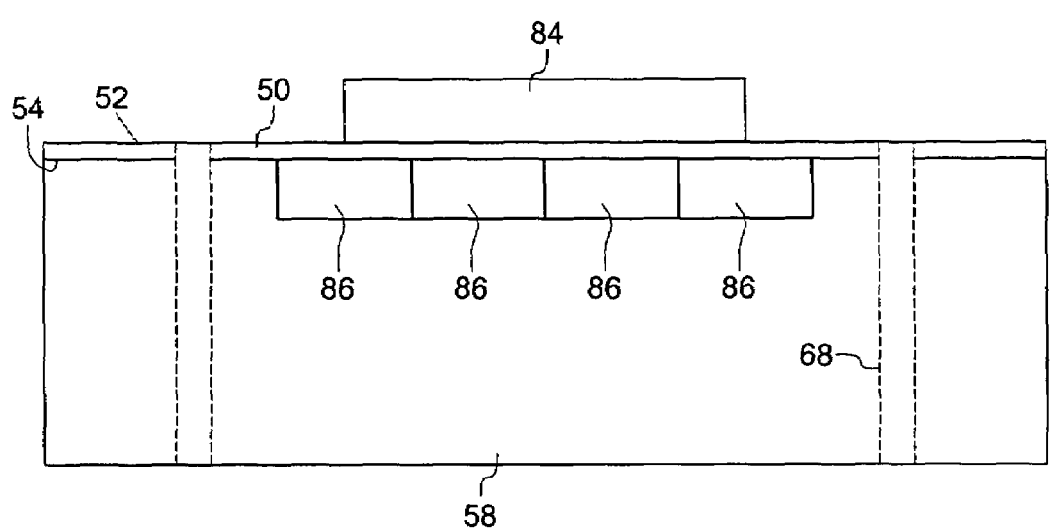
FIG. 6 is a diagrammatic illustration of the sensor assembly according to yet another aspect of the present technique.

FIG. 6 illustrates another embodiment of the sensor assembly 46, where the sensor is a direct conversion material for example, a single crystal of cadmium zinc telluride (CZT) 84 disposed on a first substrate 50. In the illustrated embodiment, a plurality of amplifiers 86 is disposed within a mechanical substrate 58 and arranged between the first substrate 50 and the mechanical substrate 58. In this embodiment, the I/O contacts from the CZT 84 are traced to the plurality of amplifiers 86 providing the fanout in a y-direction 30.

Though the interconnect structure of the present technique is discussed with regard to imaging system, as will be appreciated, the interconnect structure of the present technique may also be used in other electronic systems such as, digital cameras, mobile communication devices, liquid crystal displays, and combinations thereof and the like.

One aspect of the present technique described herein includes a method of manufacturing the sensor assembly 46 where the front side 52 of the first substrate 50 is coupled to the sensor array 48 to form a first assembly. The second substrate 56 is then coupled to the back side 54 of the first substrate. In certain embodiments, the interconnect structure may be tested for reliability before coupling the sensor array 46 to the front side 52 of the first substrate 50 of the interconnect structure. The modular approach to manufacturing of the sensor assembly may reduce the costs associated with discarding entire sensor assembly after test if a failure is detected.

An electronic device such as, the ASICs 60 or amplifiers 86, may be coupled to either the first substrate 50 or to the second substrate 56. Following this, fanout traces are fabricated onto the second substrate using techniques known to one skilled in the art. In certain embodiments, where the ASIC 60 or amplifiers 86 are disposed onto the first substrate, the fanout may be fabricated in a z-direction 32. In other embodiments, where the ASIC 60 or the amplifiers 86 are disposed on the second substrate, the fanout may be fabricated in a y-direction 30.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An interconnect structure for an electronic system, wherein the interconnect structure comprises:

a first substrate comprising a flexible material, wherein the first substrate comprises a front side and a back side, wherein the first substrate is configured to receive a sensor on the front side, and wherein the first substrate comprises a material configured to have a high density of a plurality of input/output contacts; and a second substrate coupled to the back side of the first substrate and comprising a rigid material, and wherein the second substrate comprises a material configured to have a low density of a plurality of input/output contacts.

2. The interconnect structure according to claim 1, wherein the first substrate is configured to facilitate fabrication of a plurality of input/output contacts, having a high density, wherein the high density in the range from about from about 100 to about 800 contacts/cm$^2$.

3. The interconnect structure according to claim 1, wherein the first substrate is configured to provide a fanout to electronic device, wherein the fanout comprises distributing a high density configuration of the electronic device from the first substrate onto the second substrate, wherein the second substrate comprises a lower density of input/output contacts.

4. The interconnect structure according to claim 1, wherein the first substrate comprises a polymer.

5. The interconnect structure according to claim 4, wherein the polymer comprises one of a polyimide, polyethylene terephthalate, or polyetherimide.

6. The interconnect structure according to claim 1, wherein the second substrate comprises one of a printed circuit board, ceramic substrate, mechanical support, or combinations thereof.

7. The interconnect structure according to claim 1, wherein the interconnect structure is coupled to at least one electronic device.

8. The interconnect structure according to claim 7, wherein the electronic device comprises imaging equipment, digital cameras, liquid crystal displays, sensors, mobile communication devices, or combinations thereof.

9. The interconnect structure according to claim 8, wherein the sensor is a single crystal of cadmium zinc telluride.

10. A sensor assembly for use in an electronic device, the sensor assembly comprising:
a first substrate comprising a flexible material, wherein the first substrate comprises a front side and a back side, and wherein the first substrate is configured to receive a sensor on the front side;
a second substrate coupled to the back side of the first substrate and comprising a rigid material;
a sensor array disposed on the front side of the first substrate, wherein the sensor array is configured to receive waveform signals and convert the waveform signals to corresponding electrical signals, wherein the waveform signals comprise acoustic signals; and
at least one electronic device configured for converting the electrical signals to corresponding digital signals.

11. The sensor assembly according to claim 10, wherein the waveform signals comprise X-ray signals.

12. The sensor assembly according to claim 11, comprising a computed tomography detector.

13. The sensor assembly according to claim 10, comprising an ultrasound detector.

14. The sensor assembly according to claim 10, wherein the sensor array is tile-able in a z-direction.

15. The sensor assembly according to claim 10, wherein the first substrate comprises a material configured to have a high density of a plurality of input/output contacts, and wherein the second substrate comprises a material configured to have a low density of a plurality of input/output contacts.

16. The sensor assembly according to claim 10, wherein the first substrate is configured to facilitate fabrication of a plurality of input/output contacts having a high density in the range from about 100 to about 800 contacts per cm$^2$.

17. The sensor assembly according to claim 10, wherein the first substrate is configured to provide a fanout to the sensor array disposed on the front side of the first substrate, wherein the fanout comprises distributing a high density configuration of the sensor array from the first layer onto the second substrate, wherein the second substrate comprises a lower density of input/output contacts.

18. The sensor assembly according to claim 17, wherein the fanout is along a z-direction.

19. The sensor assembly according to claim 17, wherein the fanout is along a y-direction.

20. The sensor assembly, according to claim 10, wherein the first substrate comprises a polymer.

21. The sensor assembly according to claim 20, wherein the polymer comprises one of a polyimide, polyethylene terephthalate, or polyetherimide.

22. The sensor assembly according to claim 10, wherein the second substrate comprises one of a printed circuit board, ceramic substrate, mechanical support, or combinations thereof.

23. The sensor assembly according to claim 10, wherein the electronic device comprises at least one of an application specific integrated circuit, an amplifier, or combinations thereof.

24. A detector module for use in an imaging device, the detector module comprising:
at least one sensor array configured for receiving waveform signals and converting the waveform signals to corresponding electrical signals, wherein the waveform signals comprise acoustic signals;
at least one electronic device configured for converting the electrical signals to corresponding digital signals; and
an electronic circuit comprising an interconnect structure coupled to the at least one sensor array and the at least one electronic device;
wherein the interconnect structure for an electronic device comprises:
a first substrate comprising a flexible material, wherein the first substrate comprises a front side and a back side, and wherein the first substrate is configured to receive a sensor on the front side; and
a second substrate coupled to the first substrate and comprising a rigid material.

25. The detector module according to claim 24, wherein the waveform signals comprise X-ray signals.

26. The detector module according to claim 25, comprising a computed tomography detector.

27. The detector module according to claim 24, comprising an ultrasound detector.

28. The detector module according to claim 24, wherein the first substrate comprises a material configured to have a high density of a plurality of input/output contacts, and wherein the second substrate comprises a material configured to have a low density of a plurality of input/output contacts.

29. The detector module according to claim 24, wherein the first substrate is configured to facilitate fabrication of a plurality of input/output contacts having a high density in the range from about from about 100 to about 800 contacts per cm².

30. The detector module according to claim 24, wherein the first substrate is configured to provide a fanout to the at least one electronic device, wherein the fanout comprises distributing a high density configuration of the electronic device from the first substrate onto the second substrate comprising a lower density of input/output contacts.

31. The detector module according to claim 30, wherein the fanout is along a z-direction.

32. The detector module according to claim 30, wherein the fanout is along a y-direction.

33. The detector module according to claim 24, wherein the flexible substrate comprises a polymer.

34. The detector module according to claim 33, wherein the polymer comprises at least one of a polyimide, polyethylene terephthalate, or polyetherimide.

35. The detector module according to claim 24, wherein the second substrate comprises a printed circuit board, ceramic substrate, mechanical support, or combinations thereof.

36. The detector module according to claim 24, wherein the interconnect structure is coupled to at least one electronic device.

37. The detector module according to claim 36, wherein the electronic device comprises imaging equipment, digital cameras, liquid crystal displays, sensors, mobile communication devices, or combinations thereof.

38. The detector module according to claim 37, wherein the sensor is a cadmium zinc telluride.

39. A method for manufacturing a sensor assembly, the method comprising:
   providing a first substrate comprising a flexible material, wherein the first substrate comprises a front side and a back side, and wherein the first substrate is configured to receive a sensor on the front side;
   coupling a sensor to the front side of the first substrate to form a first assembly;
   coupling a second substrate comprising a rigid material to the backside of the first substrate to form a second assembly; and
   fabricating at least one fanout trace onto the second substrate.

40. The method according to claim 39, comprising coupling an electronic device to the front side of the first substrate.

41. The method according to claim 40, wherein the electronic device comprises one of an application specific integrated circuit, an amplifier, or combinations thereof.

42. The method according to claim 39, comprising coupling an electronic device to the backside of the second substrate.

43. The method according to claim 39, further comprising testing the first substrate prior to coupling the second substrate to the back side of the first substrate.

44. The method according to claim 39, wherein the at least one fanout trace is fabricated in a z-direction.

45. The method according to claim 39, wherein the at least one fanout trace is fabricated in a y-direction.

46. A sensor assembly for use in an electronic device, the sensor assembly comprising:
   a first substrate comprising a flexible material, wherein the first substrate comprises a front side and a back side, wherein the first substrate is configured to receive a sensor on the front side, and wherein the first substrate comprises a material configured to have a high density of a plurality of input/output contacts;
   a second substrate coupled to the back side of the first substrate and comprising a rigid material, and wherein the second substrate comprises a material configured to have a low density of a plurality of input/output contacts;
   a sensor array disposed on the front side of the first substrate, wherein the sensor array is configured to receive waveform signals and convert the waveform signals to corresponding electrical signals; and
   at least one electronic device configured for converting the electrical signals to corresponding digital signals.

47. A detector module for use in an imaging device, the detector module comprising:
   at least one sensor array configured for receiving waveform signals and converting the waveform signals to corresponding electrical signals;
   at least one electronic device configured for converting the electrical signals to corresponding digital signals; and
   an electronic circuit comprising an interconnect structure coupled to the at least one sensor array and the at least one electronic device;
   wherein the interconnect structure for an electronic device comprises:
   a first substrate comprising a flexible material, wherein the first substrate comprises a front side and a back side, wherein the first substrate is configured to receive a sensor on the front side, and wherein the first substrate comprises a material configured to have a high density of a plurality of input/output contacts; and
   a second substrate coupled to the first substrate and comprising a rigid material, and wherein the second substrate comprises a material configured to have a low density of a plurality of input/output contacts.

48. A method for manufacturing a sensor assembly, the method comprising:
   providing a first substrate comprising a flexible material, wherein the first substrate comprises a front side and a back side, and wherein the first substrate is configured to receive a sensor on the front side;
   coupling a sensor to the front side of the first substrate to form a first assembly;
   coupling a second substrate comprising a rigid material to the backside of the first substrate to form a second assembly; and
   coupling an electronic device to the backside of the second substrate.

* * * * *